United States Patent
Suzuki

(10) Patent No.: US 9,875,051 B2
(45) Date of Patent: Jan. 23, 2018

(54) MEMORY SYSTEM THAT CONTROLS POWER STATE OF BUFFER MEMORY

(71) Applicant: Toshiba Memory Corporation, Tokyo (JP)

(72) Inventor: Hirotaka Suzuki, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/049,756

(22) Filed: Feb. 22, 2016

(65) Prior Publication Data

US 2016/0313941 A1    Oct. 27, 2016

Related U.S. Application Data

(60) Provisional application No. 62/152,210, filed on Apr. 24, 2015.

(51) Int. Cl.
| | | |
|---|---|---|
| G11C 8/00 | (2006.01) | |
| G06F 3/06 | (2006.01) | |
| G11C 5/14 | (2006.01) | |
| G06F 1/32 | (2006.01) | |
| G06F 12/00 | (2006.01) | |
| G11C 11/00 | (2006.01) | |
| G11C 11/417 | (2006.01) | |
| G11C 16/10 | (2006.01) | |

(52) U.S. Cl.
CPC .......... *G06F 3/0625* (2013.01); *G06F 1/3275* (2013.01); *G06F 1/3287* (2013.01); *G06F 3/061* (2013.01); *G06F 3/0655* (2013.01); *G06F 3/0688* (2013.01); *G06F 12/00* (2013.01); *G11C 5/148* (2013.01); *G11C 11/005* (2013.01); *G11C 11/417* (2013.01); *G11C 16/10* (2013.01); *Y02B 60/1228* (2013.01); *Y02B 60/1282* (2013.01)

(58) Field of Classification Search
CPC ........ G11C 5/147; G11C 5/14; G11C 11/4074
USPC ................................ 365/230.03, 185.11, 226
See application file for complete search history.

(56) References Cited

U.S. PATENT DOCUMENTS

| | | |
|---|---|---|
| 5,813,022 A | 9/1998 | Ramsey et al. |
| 6,041,401 A | 3/2000 | Ramsey et al. |
| 7,944,770 B2 | 5/2011 | Yoshimi |
| 2005/0195635 A1* | 9/2005 | Conley ............... G06F 12/0862 365/149 |

* cited by examiner

*Primary Examiner* — Son Dinh

(74) *Attorney, Agent, or Firm* — Patterson & Sheridan, LLP

(57) ABSTRACT

A memory device includes a nonvolatile memory unit, a volatile memory unit including first and second memory modules, and a controller configured to store data from the nonvolatile memory unit in the volatile memory unit before the data are transferred to a host. While the controller stores the data in the first memory module, the first memory module is in a first power state and the second memory module is in a second power state. The first power state corresponds to a high power consumption state and the second power state corresponds to a low power consumption state.

16 Claims, 12 Drawing Sheets

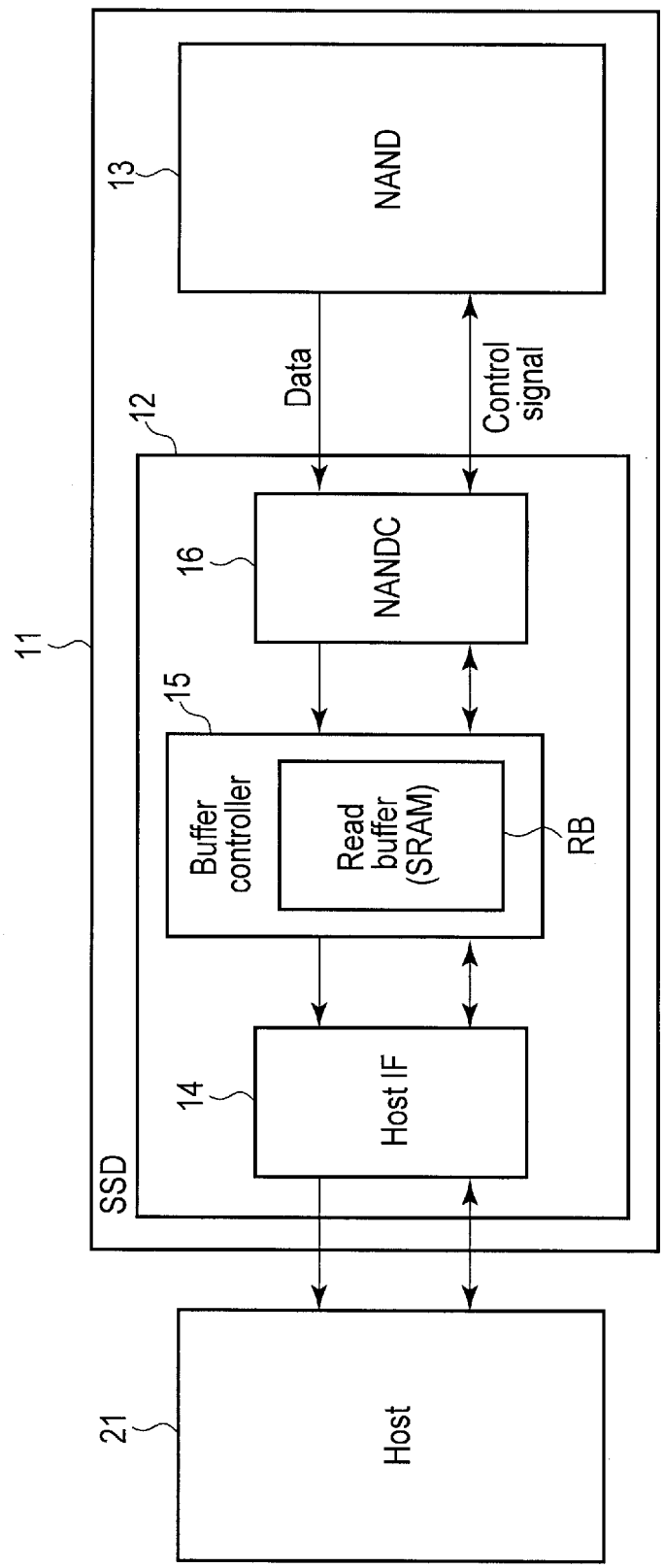
F I G. 1

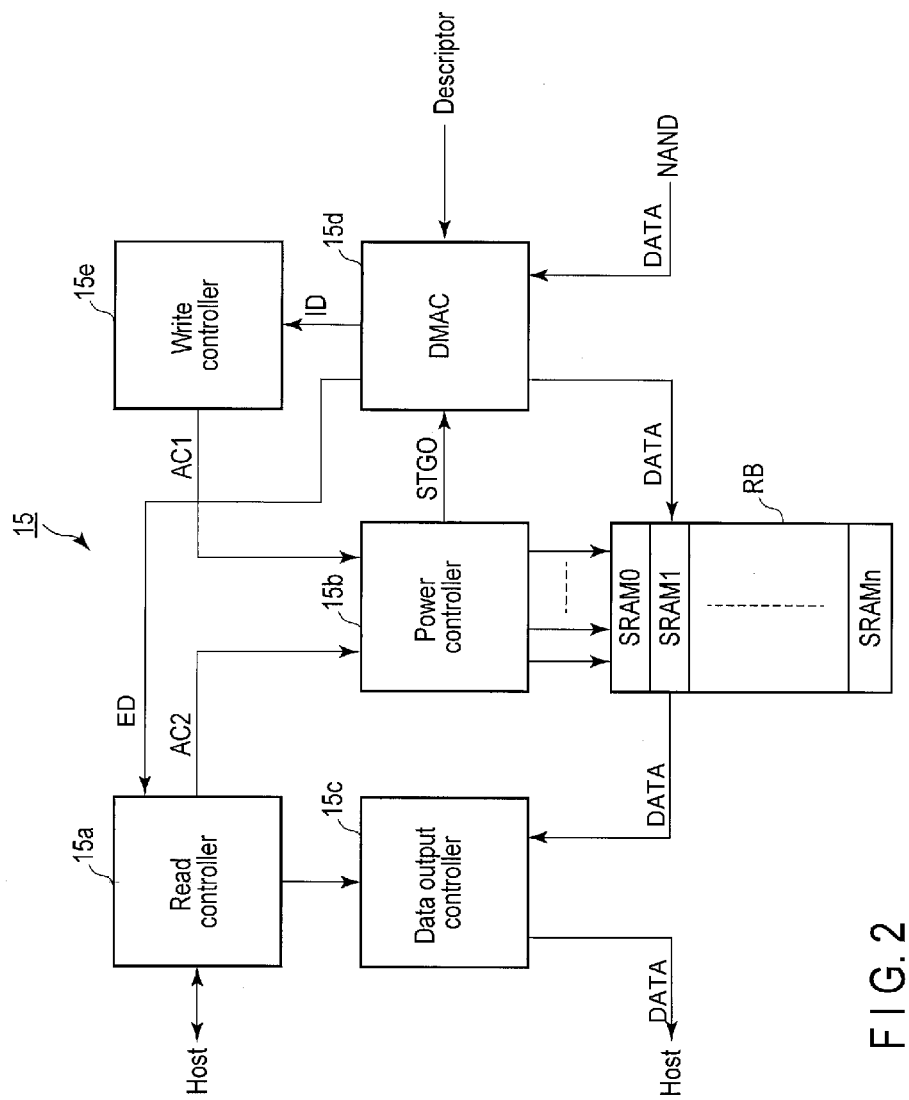
F I G. 2

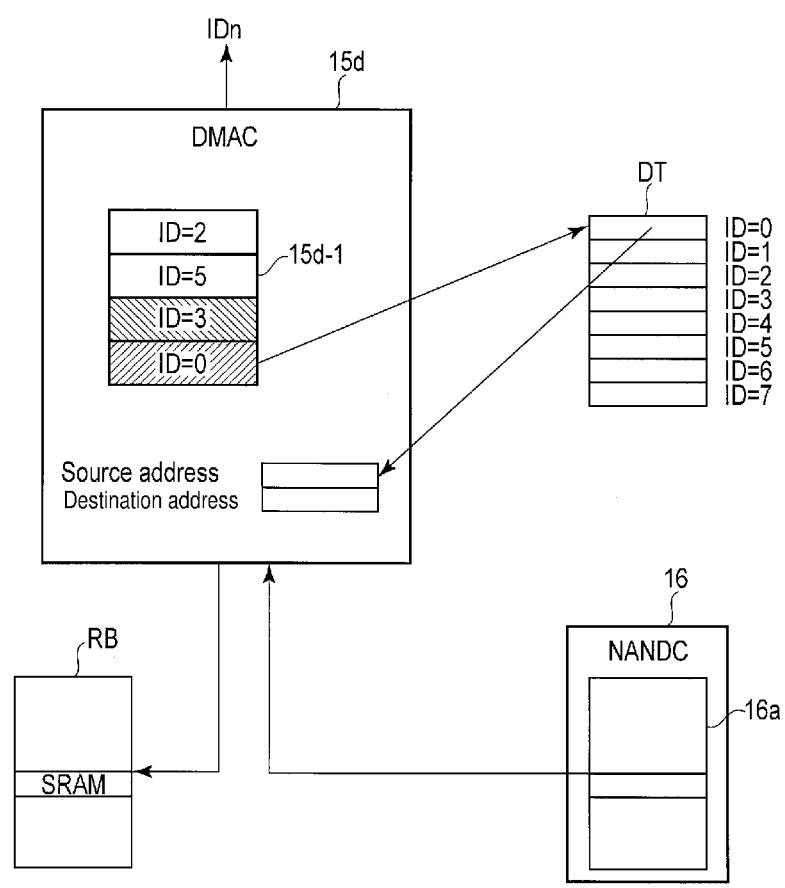
F I G. 4

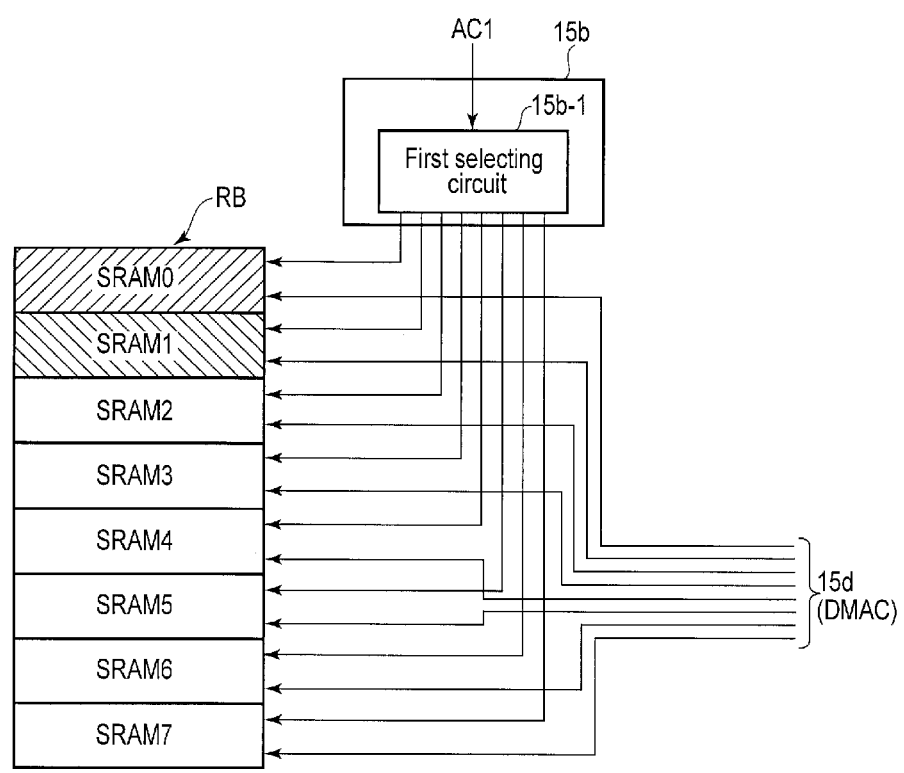
F I G. 5

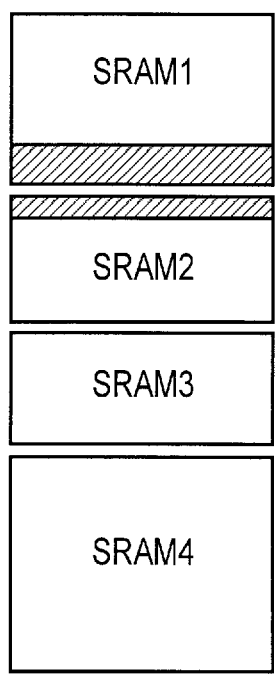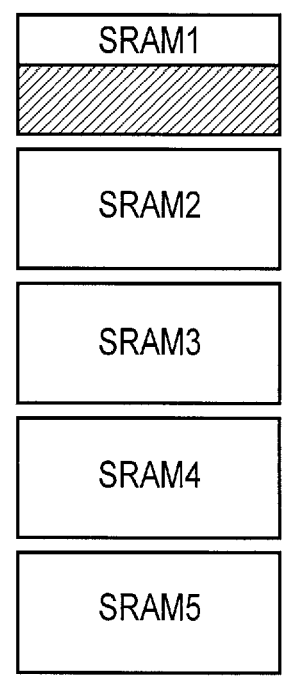
F I G. 11A            F I G. 11B

MEMORY SYSTEM THAT CONTROLS POWER STATE OF BUFFER MEMORY

CROSS-REFERENCE TO RELATED APPLICATION

This application is based upon and claims the benefit of priority from U.S. Provisional Patent Application No. 62/152,210, filed Apr. 24, 2015, the entire contents of which are incorporated herein by reference.

FIELD

Embodiments described herein relate generally to a memory system including static RAM (SRAM).

BACKGROUND

A solid-state drive (SSD) includes, for example, a buffer using an SRAM. The SRAM consumes power to maintain stored data even in a non-accessed state. For this reason, the power consumption by the SRAM is an important factor that prevents reduction of power consumed in a system-on-a-chip (SoC) of the SSD.

BRIEF DESCRIPTION OF THE DRAWINGS

FIG. 1 is a block diagram of a memory system according to a first embodiment.

FIG. 2 is a block diagram of a buffer controller in the memory system.

FIG. 4 schematically illustrates a configuration of a DMA controller in the buffer controller.

FIG. 5 schematically illustrates a data write in the buffer controller.

FIG. 11A illustrates data buffered in the buffer controller according to a comparative example.

FIG. 11B illustrates data buffered in the buffer controller according to the first embodiment.

DETAILED DESCRIPTION

Figure 3:
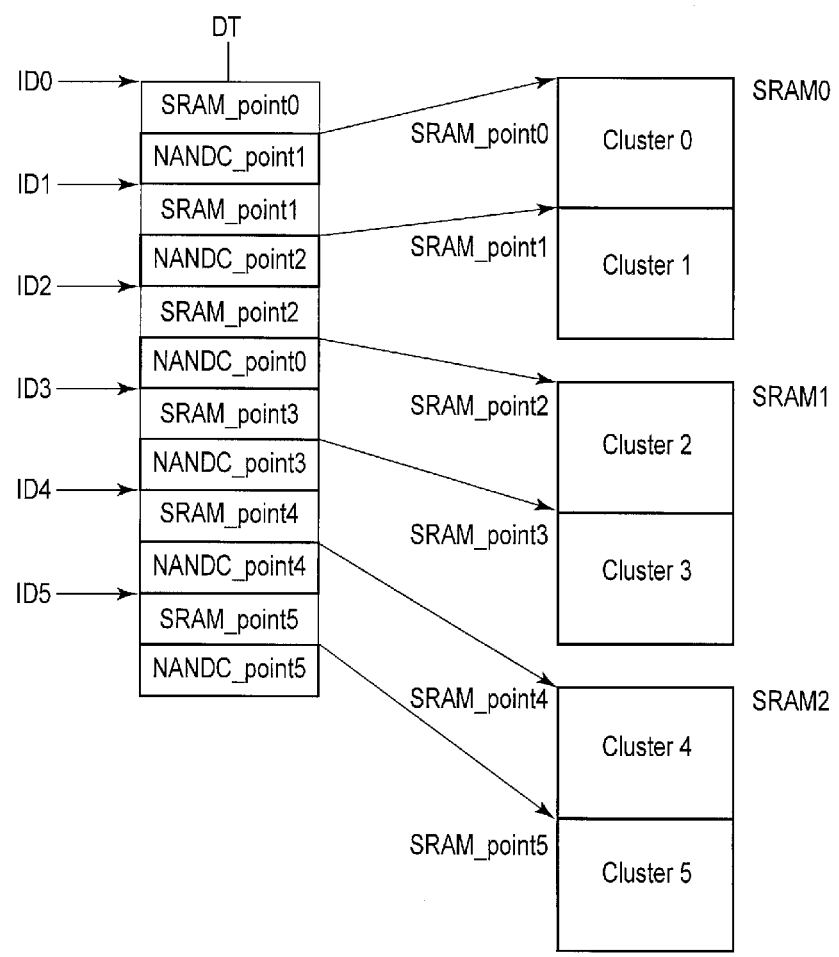
FIG. 3 illustrates an example of a descriptor table used for DMA transfer carried out in the buffer controller.

In general, according to an embodiment, a memory device includes a nonvolatile memory unit, a volatile memory unit including first and second memory modules, and a controller configured to store data from the nonvolatile memory unit in the volatile memory unit before the data are transferred to a host. While the controller stores the data in the first memory module, the first memory module is in a first power state and the second memory module is in a second power state. The first power state corresponds to a high power consumption state and the second power state corresponds to a low power consumption state.

First Embodiment

Embodiments will be described hereinafter with reference to the accompanying drawings. The same portions are denoted by the same reference numbers and symbols in the drawings.

FIG. 1 schematically shows a memory system according to a first embodiment. In FIG. 1, a data read system of SSD 11, which is an example of the memory system, includes a controller 12 and a NAND flash memory (hereinafter called NAND) 13.

The controller 12 includes a host interface (IF) 14, a buffer controller 15, and a NAND controller (hereinafter "NANDC") 16.

The host IF 14 is, for example, an interface of a serial attached SCSI (SAS), which communicates various types of requests, addresses, data, etc., with a host 21. The requests include, for example, a write command instructing a data write, a read command instructing a data read, and an erase command instructing a data erase, etc.

The buffer controller 15 controls read/write operations of a read buffer RB, based on the read command issued by the host 21. The read buffer RB includes, for example, an SRAM, which serves as a volatile memory having a power-saving function and temporarily stores the data read from the NAND 13.

The buffer controller 15 selectively controls power-on/power-off of the SRAM of the read buffer RB, and controls the operations of reading/writing the data from/to the SRAM.

When the buffer controller 15 writes the data to the read buffer RB, the buffer controller 15 executes direct memory access (DMA) transfer using a descriptor.

When the buffer controller 15 transfers the data stored in the read buffer RB to the host 21, the buffer controller 15 determines whether the host IF 14 can receive the data or not, and, if the host IF 14 can receive the data, transfers the data to the host IF 14.

The NANDC 16 controls access to the NAND 13, for example, the data read, the data write, and the data erase, etc. The data written to the NAND 13 is temporarily held in the NANDC 16. The data read from the NAND 13 is also temporarily held in the NANDC 16. In the data read, when DMA transfer is activated by the buffer controller 15, the data held in the NANDC 16 is transferred to the read buffer RB.

The NAND 13 includes a plurality of blocks. The block is a unit of the data erase. A cluster is a smallest unit of the data to be written to the NAND 13. One cluster includes, for example, eight sectors or eight logical addresses. The sector is a smallest unit of data transfer to and from the host 21 and one sector is, for example, 512 bytes. The logical address is allocated to each sector.

(Configuration of Buffer Controller)

FIG. 2 is a block diagram of the buffer controller 15 which controls the read buffer RB. The buffer controller 15 includes a read controller 15a, a power controller 15b, a data output controller 15c, a direct memory access controller (DMAC) 15d, and a write controller 15e.

The read buffer RB including SRAMs is sectioned into a plurality of memory regions (hereinafter referred to as SRAMn where n is a natural number including zero). SRAM0 to SRAMn do not need to be physically separated from each other, but each of SRAM0 to SRAMn may be accessed independently of each other.

Each of SRAM0 to SRAMn can be set to a power-on state (first state) and a power-off state (second state). The power-on state is a state in which a general read or write access can be made to corresponding one of SRAM0 to SRAMn, and the power-off state is a state in which an access cannot be made to the corresponding one of SRAM0 to SRAMn and the power consumption in the power-off state is smaller than that in the power-on state. The data stored in any one of SRAM0 to SRAMn in the power-on state is also held in the power-off state. For this reason, the data stored in any one of SRAM0 to SRAMn can be read when the one of SRAM0 to SRAMn are set in the power-on state again.

Thus, SRAM0 to SRAMn can be selectively accessed, and the power consumption of the read buffer RB can be reduced since the SRAM which is not accessed is set to the power-off state. In order to change the states of SRAM0 to SRAMn from the power-off state to the power-on state, a predetermined period is required from the time when the control signal is asserted to the time when SRAM0 to SRAMn can be accessed.

The SRAM is, for example, an SRAM comprising six transistors, an SRAM using a resistance change element, etc.

Each of SRAM0 to SRAMn has a storage capacity of, for example, an integer multiple of the smallest data transfer unit (sector) handled by the host 21. More specifically, each of SRAM0 to SRAMn is composed of a plurality of clusters, and each of clusters is composed of, for example, eight sectors. In other words, each of SRAM0 to SRAMn includes a plurality of clusters. By thus setting the storage capacity of each of SRAM0 to SRAMn to be an integer multiple of the data transfer unit, the data can be prevented from being stored in a plurality of SRAMs and transferred therefrom. When the data is stored in a plurality of SRAMs and transferred therefrom, the plurality of SRAMs need to be set in the power-on state simultaneously. For this reason, the power consumption may not be reduced sufficiently. By setting the storage capacity of each of SRAM0 to SRAMn to be an integer multiple of the data transfer unit according to the present embodiment, however, the plurality of SRAMs do not need to be set in the power-on state simultaneously and the power consumption can be reduced.

When the data is written to any one of SRAM0 to SRAMn, the DMAC 15d serving as a transfer controller first reads the descriptor from a descriptor table DT and transfers the descriptor to the write controller 15e.

The write controller 15e generates access information AC1 indicating selection of one of SRAM0 to SRAMn, based on the descriptor supplied from the DMAC 15d, and supplies the access information AC1 to the power controller 15b.

The power controller 15b controls power-on/power-off of SRAM0 to SRAMn, based on the access information AC1 from the write controller 15e, during the data write. The power controller 15b sets one of SRAM0 to SRAMn to the power-on state, based on the access information AC1. When the selected SRAM becomes usable, the power controller 15b outputs a signal STG0 indicating that the selected SRAM is ready to receive data, to the DMAC 15d.

When the transfer permission signal STG0 is received from the power controller 15b, the DMAC 15d transfers the data read from the NAND 12 to the SRAM which is set in the power-on state, in accordance with the descriptor.

When the data transfer to the SRAM is completed, the DMAC 15d supplies readable SRAM identification information to the read controller 15a.

Next, when the data is read from any one of SRAM0 to SRAMn, the read controller 15a produces access information AC2 indicating selection of one of SRAM0 to SRAMn, based on a permission signal from the host 21 and the readable SRAM identification information from the DMAC 15d.

The power controller 15b controls power-on/power-off of SRAM0 to SRAMn, based on the access information AC2 from the read controller 15a, during the data read.

The data output controller 15c transfers the data read from the SRAM in the power-on state, of SRAM0 to SRAMn, to the host IF 14, based on the access information of SRAM0 to SRAMn from the read controller 15a.

(Configuration of Write System in Read Buffer RB)
(Descriptor Table)

FIG. 3 shows an example of the descriptor table DT used for the DMA transfer. A descriptor is, for example, transfer information for performing DMA transfer of the data read from the NAND 13 to SRAM0 to SRAMn. The transfer information includes, for example, a source address, a destination address, etc. The descriptor table DT includes a plurality of descriptors.

The descriptor table DT is generated by, for example, firmware (not shown) included in the controller 12, for example, during an initialization routine of the SSD 11. The descriptor table DT is stored in a volatile memory (not shown) included in the controller 12, an SRAM, or a DRAM. The SRAM or DRAM is always set in the power-on state. The descriptor table DT may not be generated by the firmware in the controller 12, and instead by firmware (not shown) in the buffer controller 15.

The descriptor table DT includes identification code IDn (where n is a natural number including zero) of each descriptor. During the initialization routine of the SSD 11, correspondence of each cluster of SRAM0 to SRAMn to the identification code IDn of the descriptor table DT is defined.

In FIG. 3, for example, cluster 0 of SRAM0 is associated with ID0, and cluster 1 of SRAM0 is associated with ID1. In addition, cluster 2 of SRAM1 is associated with ID2, and cluster 3 of SRAM1 is associated with ID3. Since the correspondence between the identification code IDn and SRAM0 to SRAMn is defined in this manner, a SRAM can be identified from the corresponding identification code IDn.

When the data which is stored in a buffer of the NANDC 16 is ready to be transferred, transfer information is set in one of the descriptors indicated by the identification code IDn of the descriptor table DT.

The source address, the destination address, etc., are set in each descriptor as the transfer information. The source address is an address (NANDC_point n) of the buffer in the NANDC 16, and the destination address is the address information, for example, the cluster address, indicating one of SRAM0 to SRAMn.

In FIG. 3, destination address SRAM_point0 indicating cluster 0 of SRAM0 and source address NANDC_point1 indicating address in the buffer of the NANDC 16 are set in, for example, the descriptor of ID0, and destination address SRAM_point1 indicating cluster 1 of SRAM0 and source address NANDC_point2 indicating address in the buffer of the NANDC 16 are set in, for example, the descriptor of ID1. In addition, destination address SRAM_point2 indicating cluster 2 of SRAM1 and source address NANDC_point0 are set in, for example, the descriptor of ID2.

(Configuration of DMAC)

FIG. 4 schematically shows a configuration of the DMAC 15d. The DMAC 15d includes a first buffer 15d-1. The first buffer 15d-1 is, for example, a first-in first-out buffer. For example, the identification codes IDn of the descriptors set in the descriptor table DT are sequentially set by firmware, in the first buffer 15d-1.

The data read from the NAND 13 has been transferred to the buffer 16a of the NANDC 16 as shown in FIG. 4. When the data in the buffer 16a becomes capable of being transferred to the read buffer RB, the information such as the source address and the destination address is set in the descriptor of the descriptor table DT by the firmware. The identification code IDn of the descriptor table DT, indicating the position of the descriptor in which the information is set, is set in the first buffer 15d-1.

The DMAC 15d refers to the descriptor table TD, based on the oldest identification code IDn set in the first buffer 15d-1, and reads the source address and the destination address from the descriptor corresponding to the identification code IDn. The DMAC 15d reads the corresponding data from the buffer 16a of the NANDC 16 specified by the source address, and transfers the data to any one of SRAM0 to SRAMn specified by the destination address. At this time, the selected SRAM is in the power-on state.

Specifically, the DMAC 15d supplies the oldest identification code IDn (i.e., ID0) set in the first buffer 15d-1 to the write controller 15e. That is, since the identification code IDn corresponds to one of SRAM0 to SRAMn as explained above, the SRAM that should be set in the power-on state can be identified by the identification code IDn. The write controller 15e produces the access information AC1 indicating one of SRAM0 to SRAMn corresponding to the identification code IDn, and supplies the access information AC1 to the power controller 15b. The power controller 15b changes the state of the specified SRAM from the power-off state to the power-on state, in accordance with the access information AC1.

Furthermore, the write controller 15e and the power controller 15d changes the state of one of SRAM0 to SRAMn that is to be next accessed from the power-off state to the power-on state, in accordance with, for example, the second oldest identification code IDn (i.e., ID3) set in the first buffer 15d-1, during a period in which the data corresponding to the oldest identification code IDn (i.e., ID0) set in the first buffer 15d-1 is transferred by the DMAC 15d.

FIG. 4 indicates that the next old identification code is ID3. The power controller 15b changes the state of the SRAMn corresponding to the identification code ID3 from the power-off state to the power-on state. By thus changing the state of the SRAMn that is to be next accessed to the power-on state in advance, power consumption by the SRAM can be suppressed without increasing the standby time for data transfer.

(Power Controller)

FIG. 5 shows an example of the power controller 15b and the read buffer RB. In FIG. 5, the read buffer RB is sectioned into, for example, eight SRAM0 to SRAM7.

The power controller 15b includes a first selecting circuit 15b-1. The first selecting circuit 15b-1 selects one of SRAM0 to SRAM7 and changes the state of the selected SRAM to the power-on state, based on the access information AC1 supplied from the write controller 15e. In the example shown in FIG. 5, SRAM0 has been changed to the power-on state, based on the access information AC1. In this state, the data is transferred from the DMAC 15c to the SRAM0 in the power-on state. FIG. 5 further indicates that the next selected SRAM1 is changed to the power-on state.

(Write Timing)

Figure 6:
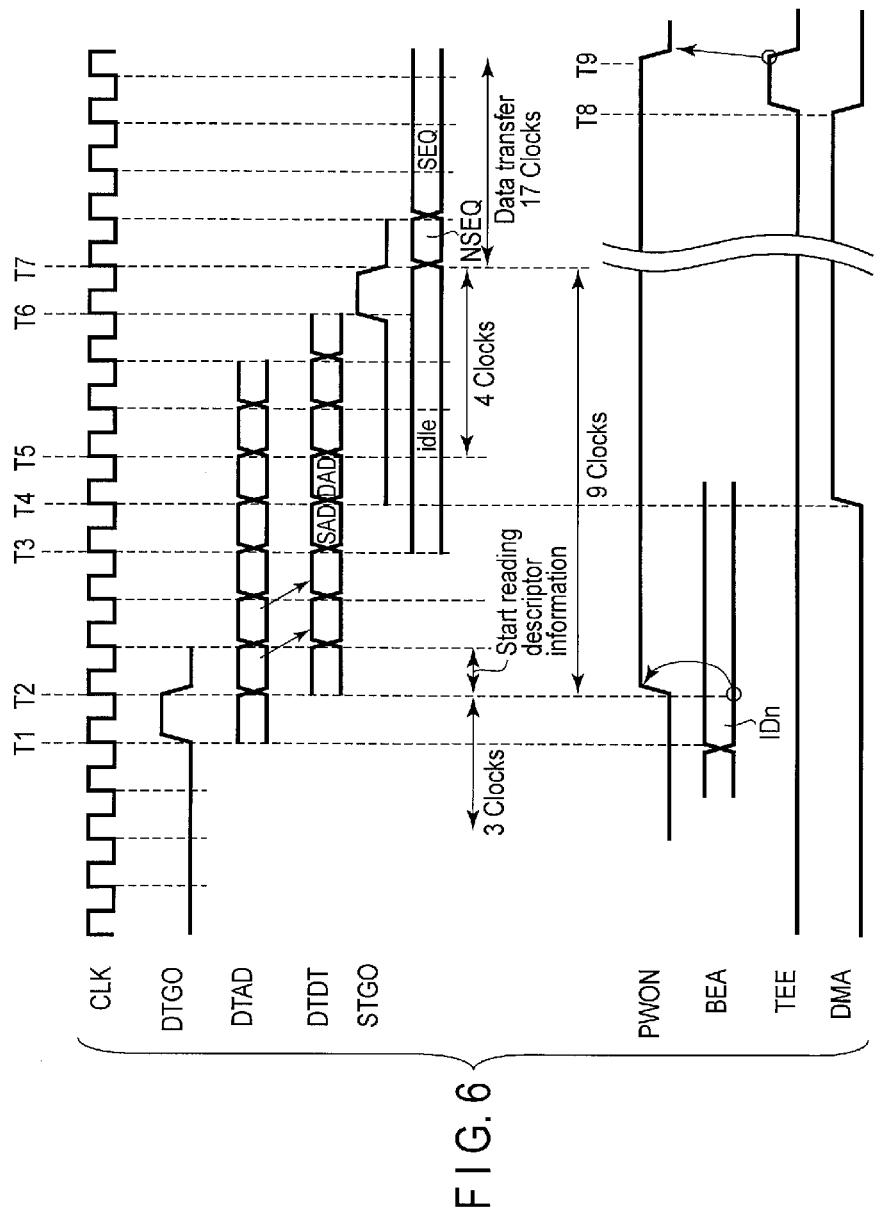
FIG. 6 is a timing chart showing an example of the DMA transfer when a single data unit is written.

FIG. 6 shows an example of the operation of DMA transfer executed by the DMAC 15d. In FIG. 6, CLK is a clock signal, DTG0 is a signal indicating a descriptor read start, DTAD is a signal indicating the address of the descriptor, DTDT is data read from the buffer 16a of the NANDC 16, STG0 is a signal indicating data transfer start timing, PWON is a signal indicating the power-on state of the SRAM in the read buffer RB, BEA is a signal indicating the destination address (address of the SRAM), TEE is a signal indicating a DMA transfer end, and DMA is a signal indicating the DMA transfer.

At time T1, for example, when the signal DTG0 indicating the descriptor read start is asserted, the oldest identification code IDn is read from the first buffer 15d-1.

At time T2, the signal PWON indicating the power-on state is asserted and, based on the read identification code IDn, the write controller 15e and the power controller 15b operate to perform the power-on processing of the SRAM selected by the first selecting circuit 15b-1. In addition, the data DTDT of the descriptor specified by the identification code IDn of the descriptor table DT is read in accordance with the signal DTAD indicating an address of the descriptor.

At time T3, the source address SAD is read from the descriptor specified by the identification code IDn of the descriptor table DT, and the signal DMA indicating the DMA transfer is asserted to enable the DMA transfer to be executed. Here, the data read from the buffer 16a of the NANDC 16 may be started at the time when the source address SAD is read.

Next, at time T4, the destination address DAD is read.

At time T5, both the source address SAD and the destination address DAD are determined. For this reason, the DMA transfer can be executed, but the SRAM requires, for example, nine clocks, after the power-on processing is started and before the SRAM becomes in an accessible power-on state. For this reason, the data transfer to the SRAM is started four clocks after time T5, i.e., at time T7.

More specifically, for example, after the signal STG0 indicating the transfer start timing is supplied from the power controller 15b to the DMAC 15d at time T6, the data transfer is executed at time T7. It should be noted that the signal STG0 may be produced in the DMAC 15d.

After that, at time T8, when the DMA transfer is ended and the signal DMA is deasserted, the signal TEE indicating the DMA transfer end is asserted.

At time T9, when the signal TEE is deasserted, the signal PWON indicating the power-on state is deasserted, and the SRAM in the power-on state is changed to the power-off state by the power controller 15b.

(Sequential Write to Same SRAM)

Figure 7:
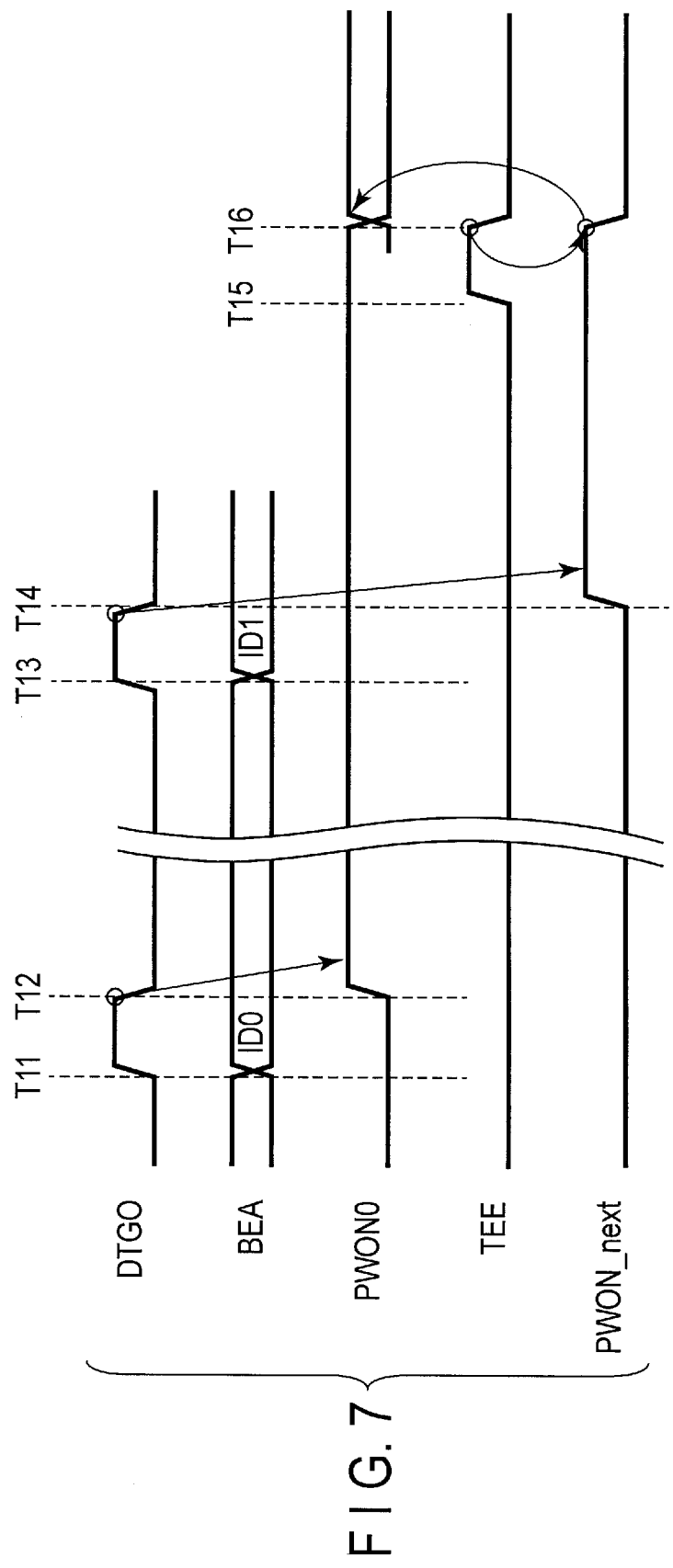
FIG. 7 is a timing chart showing an example of the DMA transfer when two data units are written in a same SRAM of a buffer.

FIG. 7 shows an example of sequentially writing two data units to the same SRAM. More specifically, FIG. 7 shows an operation in the example in which, for example, the SRAM0 is set in the power-on state based on the oldest identification code ID0 set in the first buffer 15d-1 of the DMAC 15d and then the same SRAM0 is set in the power-on state based on the second oldest identification code ID1 set in the first buffer 15d-1.

At time T11, when the signal DTG0 indicating the descriptor read start is asserted, the oldest identification code ID0 is read as shown in FIG. 7. At time T12, the signal PWON0 indicating the power-on state of the SRAM0 is asserted and the power-on processing of the SRAM0 is started, based on deassertion of the signal DTG0. Next, the data is transferred to the SRAM0, which is a destination address corresponding to the identification code ID0, after nine clocks, as described above.

Next, at time T13, which is predetermined clocks after the signal PWON0 is asserted, the next old identification code ID1 is read based on the assert of the signal DTG0 indicating the descriptor read start. Thus, the timing at which SRAM0 to be next accessed becomes the power-on state does not need to correspond to the timing at which SRAM0 that is currently accessed is set to the power-on state, and SRAM0 needs only be set in the power-on state during a period in which data is transferred to SRAM0.

Next, at time T14, the signal PWON_next indicating power-on of a next candidate is asserted based on deassertion of the signal DTG0. In this example, since the next candidate is SRAM to which data is currently transferred, SRAM0 has been already set in the power-on state.

After that, at time T15, when the DMA transfer to SRAM0 is ended, the signal TEE indicating the DMA transfer end is asserted.

Next, at time T16, the signal PWON_next is deasserted based on deassertion of the signal TEE, and the signal PWON0 indicating the power-on state of SRAM0 is asserted again based on the next identification code ID1. Next, DMA transfer to SRAM0 in the power-on state is thereby executed.

The data can be sequentially transferred to the same SRAM0 by the operations described above.

(Sequential Write to Different SRAMs)

Figure 8:
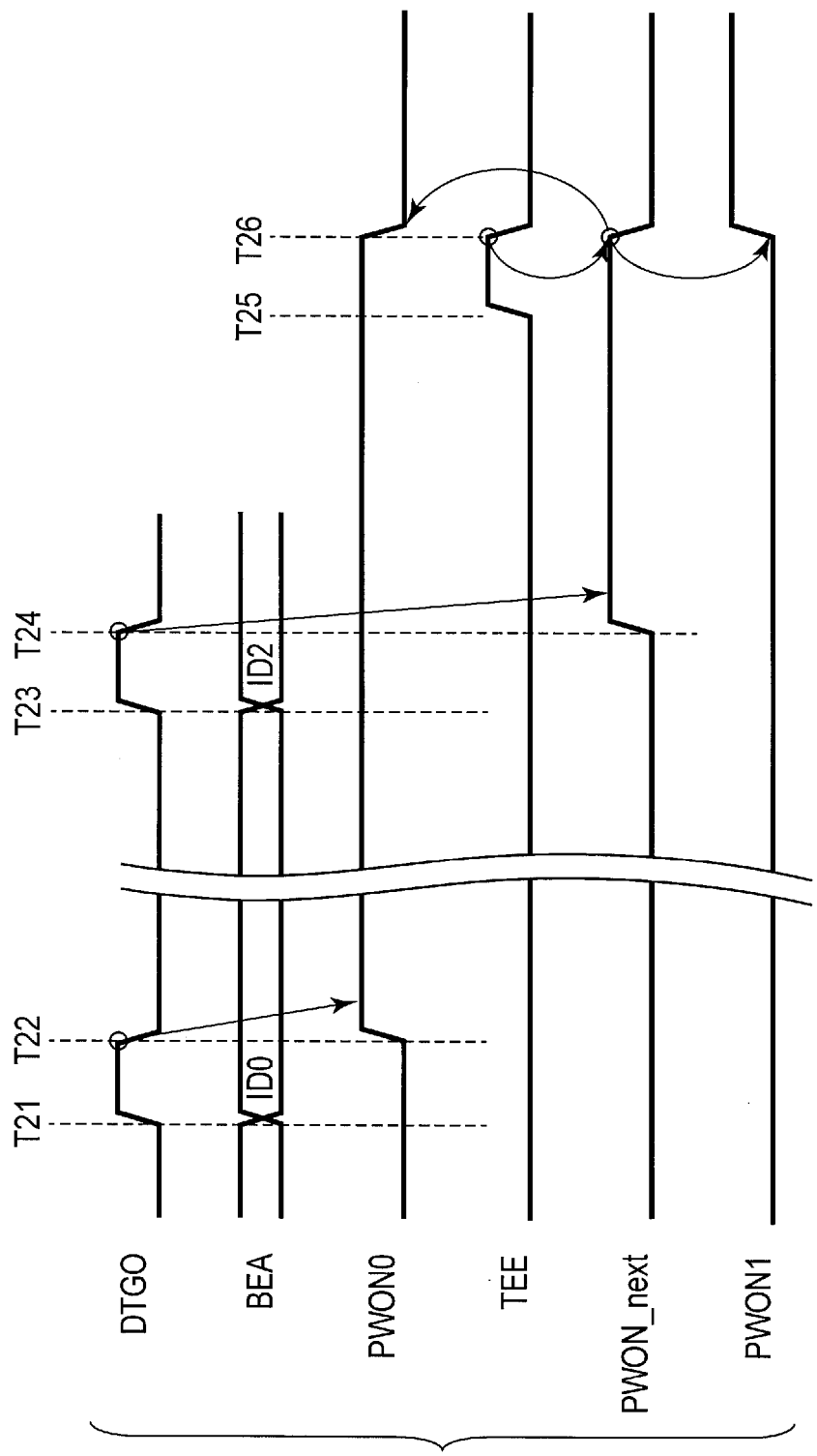
FIG. 8 is a timing chart showing an example of the DMA transfer when two data units are written in different SRAMs of the buffer.

FIG. 8 shows operations executed in a case where, for example, the SRAM0 becomes in the power-on state based on, for example, the oldest identification code ID0 and then SRAM1 different from SRAM0 becomes in the power-on state based on the second oldest identification code ID2.

At time T21, for example, the identification code ID0 set in the first buffer 15d-1 of the DMAC 15d is read in response to assert of the signal DTG0 indicating the descriptor read start.

At time T22, the signal PWON0 indicating the power-on state of the SRAM0 is asserted based on deassertion of the signal DTG0. Next, nine clocks after time T22 (not shown), the DMA transfer to the destination address of the SRAM0 indicated by the identification code ID0 is started.

Next, after the signal PWON0 is asserted, for example, the next old identification code ID2 is read based on the assertion of the signal DTG0 at time T23, which is predetermined clocks after time T22. At time T24, the signal PWON_next indicating a next candidate of power-on is asserted based on deassertion of the signal DTG0. In this example, since the next candidate of power-on is SRAM1 different from SRAM0 to which data is currently transferred, the power-on processing of SRAM1 is started.

Then, at time T25, when the DMA transfer to SRAM0 is ended, the signal TEE indicating the transfer end is asserted.

Next, at time T26, PWON_next is deasserted based on deassertion of the signal TEE, and the signal PWON1 indicating the power-on state of SRAM1 is asserted based on the next identification code ID2. Next, DMA transfer to SRAM1 in the power-on state is executed.

The data can be sequentially transferred to SRAM1 different from SRAM0 by the operations described above.

(Configuration of Read System in Read Buffer RB)

Figure 9:
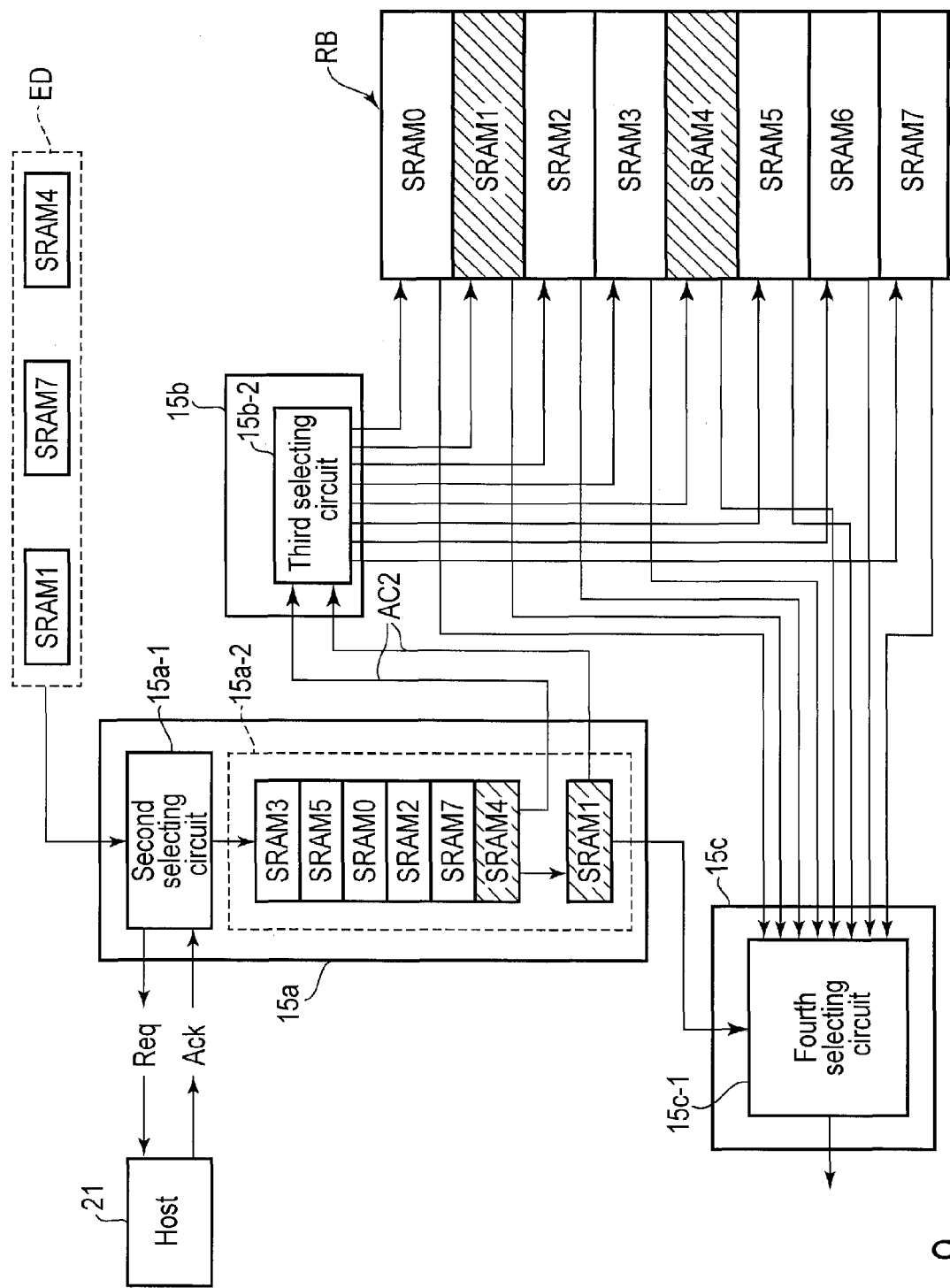
FIG. 9 schematically illustrates a data read in the buffer controller.

FIG. 9 illustrates a data read in the read buffer RB. The read controller 15a, the power controller 15b, and the data output controller 15c are connected to the read buffer RB as shown in FIG. 2.

The read controller 15a includes, for example, a second selecting circuit 15a-1 and a second buffer 15a-2. The second buffer 15a-2 is, for example, a first-in first-out buffer. The power controller 15b includes, for example, a third selecting circuit 15b-2. The data output controller 15c includes, for example, a fourth selecting circuit 15c-1.

When the data transfer to any one of SRAM0 to SRAMn is completed, the DMAC 15d supplies identification information (hereinafter, "entry data ED") indicating the SRAM from which the data read can be executed, to the read controller 15a, as described above. Each of the entry data ED includes address information for reading the data from one of SRAM0 to SRAMn or the identification code IDn of one of SRAM0 to SRAMn.

The read controller 15a may include a buffer capable of storing multiple units of the entry data ED supplied from the DMAC 15d. When the second selecting circuit 15a-1 of the read controller 15a receives the entry data ED from the DMAC 15d, the second selecting circuit 15a-1 inquires the host 21 whether or not the host 21 can accept data corresponding to the entry data ED. For this reason, the second selecting circuit 15a-1 sends a transfer request Req to the host 21. After that, if an acknowledgment Ack from the host 21 indicates access permission, the second selecting circuit 15a-1 transfers the entry data ED to the second buffer 15a-2. In contrast, if the acknowledgment Ack from the host 21 indicates access rejection, the second selecting circuit 15a-1 does not transfer the entry data ED to the second buffer 15a-2, and sends a new transfer request Req to the host 21, based on next entry data ED.

Even if the entry data ED is supplied to the read controller 15a in the order in which the data elements are transferred to SRAM0 to ARSMn, when the host 21 rejects the access, the entry data ED is not thus transferred to the second buffer 15a-2.

The second buffer 15a-2 is, for example, a first-in first-out buffer. For this reason, the oldest entry data indicates the SRAM to be accessed, in the second buffer 15a-2. In FIG. 9, SRAM1 of the second buffer 15a-2 indicates the oldest data while SRAM4 indicates the second oldest data.

The third selecting circuit 15b-2 of the power controller 15b accesses one of SRAM0 to SRAM7 of the read buffer RB, based on the oldest entry data which is access information AC2 supplied from the second buffer 15a-2, and based on the second oldest entry data, respectively.

More specifically, the third selecting circuit 15b-2 includes a first input end, a second input end, and a plurality of output ends. The oldest entry data of the second buffer 15a-2 is supplied to the first input end, while the second oldest entry data of the second buffer 15a-2 is supplied to the second input end. The plurality of output ends of the third selecting circuit 15b-2 are connected to SRAM0 to SRAM7 of the read buffer RB, respectively.

The third selecting circuit 15b-2 selects the SRAM to be currently accessed, based on the oldest entry data, and selects the SRAM to be next accessed, based on the second oldest entry data.

In FIG. 9, the third selecting circuit 15b-2 executes the power-on processing for SRAM1, based on the oldest entry data, and executes the power-on processing for SRAM4 to be next accessed, based on the second oldest entry data. For this reason, SRAM1 is first changed from the power-off state to the power-on state, and then SRAM4 is changed from the power-off state to the power-on state.

Thus, access efficiency of SRAM0 to SRAM7 can be improved by setting SRAM1 which should be currently accessed and SRAM4 which should be next accessed to the power-on state, sequentially.

Figure 10:
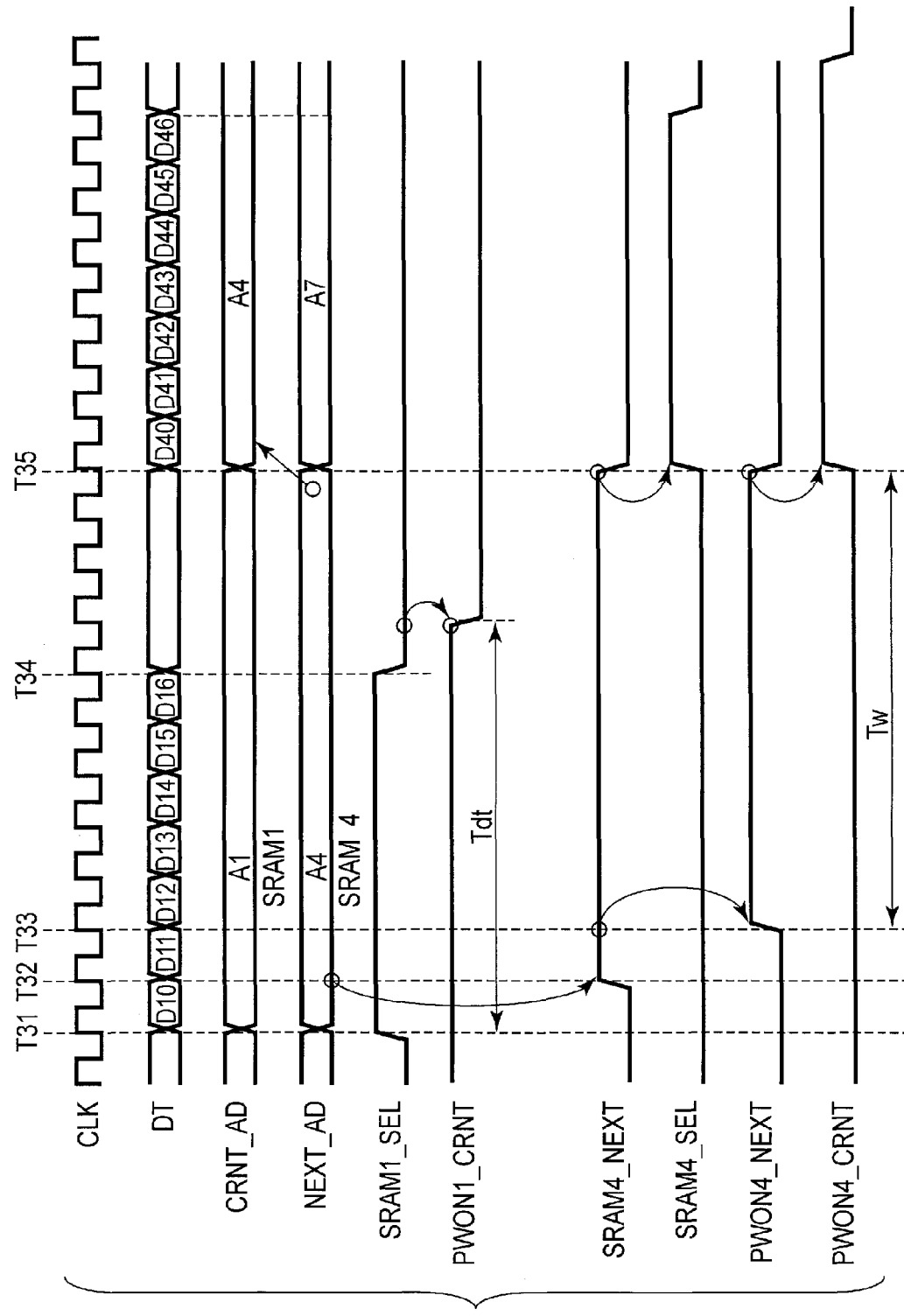
FIG. 10 is a timing chart showing an example of a read operation in the buffer controller.

FIG. 10 shows an example of operations of the third selecting circuit 15b-2 and the read buffer RB.

At time T31, a signal PWON1_CRNT indicating the power-on processing of SRAM1 has been already asserted. Also, data DT is read from the address A1 of SRAM1, which is indicated by address CRNT_AD, by asserting a signal SRAM_SEL.

Next, at time T32, signal SRAM4_NEXT is asserted, based on address A4 of SRAM4 indicated by a next address NEXT_AD.

At time T33, a signal PWON4_NEXT indicating the next power-on processing is asserted, and the power-on processing of SRAM4 is started.

At time T34, when the data read from SRAM1 is completed, the signal SRAM1_SEL is deasserted. Then, the signal PWON1_CRNT is deasserted.

After that, at time T35, the signal PWON4_NEXT is deasserted and a signal PWON4_CRNT indicating the power-on state is asserted. Simultaneously, the data DT is read from the address A4 of SRAM4 indicated by the address CRNT_AD by deasserting a signal SRAM4_NEXT and asserting a signal SRAM4_SEL.

Thus, the timing at which SRAM4 to be next accessed becomes in the power-on state does not need to correspond to the timing at which SRAM1 to be currently accessed becomes in the power-on state. SRAM4 needs to become the power-on state some time in a period during which SRAM1 transfers the data. More specifically, when a data transfer time of SRAM1 that is currently accessed is denoted by Tdt, a relationship between the data transfer time Tdt and a standby time Tw at which SRAM4 that is to be next accessed becomes in the power-on state after SRAM1 that is currently accessed becomes the power-on state may meet a condition below.

$$Tw < Tdt$$

The power consumption by the SRAM can be reduced without increasing the access standby time when this condition is met.

In FIG. 9, a plurality of input ends of the fourth selecting circuit 15c-1 in the data output controller 15c are connected to SRAM0 to SRAM7, a control signal input end of the selecting circuit is connected to the second buffer 15a-2, and an output end of the selecting circuit is connected to the host IF 14. The fourth selecting circuit 15c-1 selects the SRAM to be accessed, of SRAM0 to SRAM7, and reads the data from the selected SRAM, based on the oldest entry data in the second buffer 15a-2.

Since the oldest entry data is SRAM1, in FIG. 9, the fourth selecting circuit 15c-1 transfers the data which is read from SRAM1 to the host IF 14. In other words, the fourth selecting circuit 15c-1 transfers the data which is read from each sector of SRAM1 to the host IF 14.

Advantage of Embodiment

According to the above-described embodiment, each of SRAM0 to SRAMn of the read buffer RB has the storage capacity which is an integer multiple of the data transfer unit (sector) handled by the host 21. By setting the storage capacity of each of SRAM0 to SRAMn to be an integer multiple of the data transfer unit, the data can be prevented from being stored in a plurality of SRAMs and transferred therefrom.

If each of SRAM0 to SRAM7 is not set to be the storage capacity which is an integer multiple of the data transfer unit for the NAND 13, as shown in FIG. 11A, the data needs to be stored in a plurality of SRAMs and transferred therefrom. In this case, the plurality of SRAMs needs to be set in the power-on state simultaneously. For this reason, the power consumption may increase. In contrast, by setting the storage capacity of each of SRAM0 to SRAMn to an integer multiple of the data transfer unit, similarly to the embodiment shown in FIG. 11B, the plurality of SRAMs do not need to be powered on simultaneously. For this reason, the power consumption at the data write and the data read can be reduced.

In addition, while an SRAM is accessed, another SRAM to be next accessed is set in the power-on state, at the data write to and the data read from the read buffer RB. As the number of SRAMs simultaneously in the power-on state can be reduced, the power consumption can be reduced without increasing the data transfer speed.

In other words, at the data write, while the data is written to the selected SRAM by referring to the descriptor table DT and the oldest identification code IDn set in the first buffer 15d-1, the SRAM to be next accessed is changed to the power-on state, by referring to the descriptor table DT and the second oldest identification code IDn set in the first buffer 15d-1. For this reason, when the data based on the descriptor corresponding to the second identification code IDn is started, the data transfer efficiency can be improved since the corresponding SRAM has been already changed to the power-on state.

In addition, the identification code ID of the descriptor table DT corresponds to the addresses of SRAM0 to SRAMn. For this reason, the SRAM which should be changed to the power-on state can easily be recognized before starting the data transfer, and the power-on control can be simplified.

In addition, the second selecting circuit 15a-1 sends the transfer request Req to the host 21, based on the entry data ED, at the data read, and determines whether or not the host 21 is capable of receiving the data designated by the entry data ED. As a result, if the host 21 is incapable of receiving the data designated by the entry data ED, the second selecting circuit 15a-1 determines whether the host 21 is capable of receiving data designated by another entry data ED. For this reason, even if the data is stored in SRAM0 to SRAM7 in the order of SRAM0 to SRAM7, the entry data ED stored in the second buffer 15a-2 is replaced in the order of the entry data ED permitted by the host 21. Therefore, if the SRAMs are discontinuously selected based on the oldest entry data of the second buffer 15a-2, the data transfer to the host 21 is often interrupted due to a return time of the SRAMs. By, while transferring the data read from the SRAM to the host 21, controlling the SRAM corresponding to the next entry data to be in the power-on state, according to the present embodiment, the data transfer to the host 21 can be sequentially executed and interruption of the data transfer can be prevented when the next entry data becomes current data.

Second Embodiment

Figure 12:
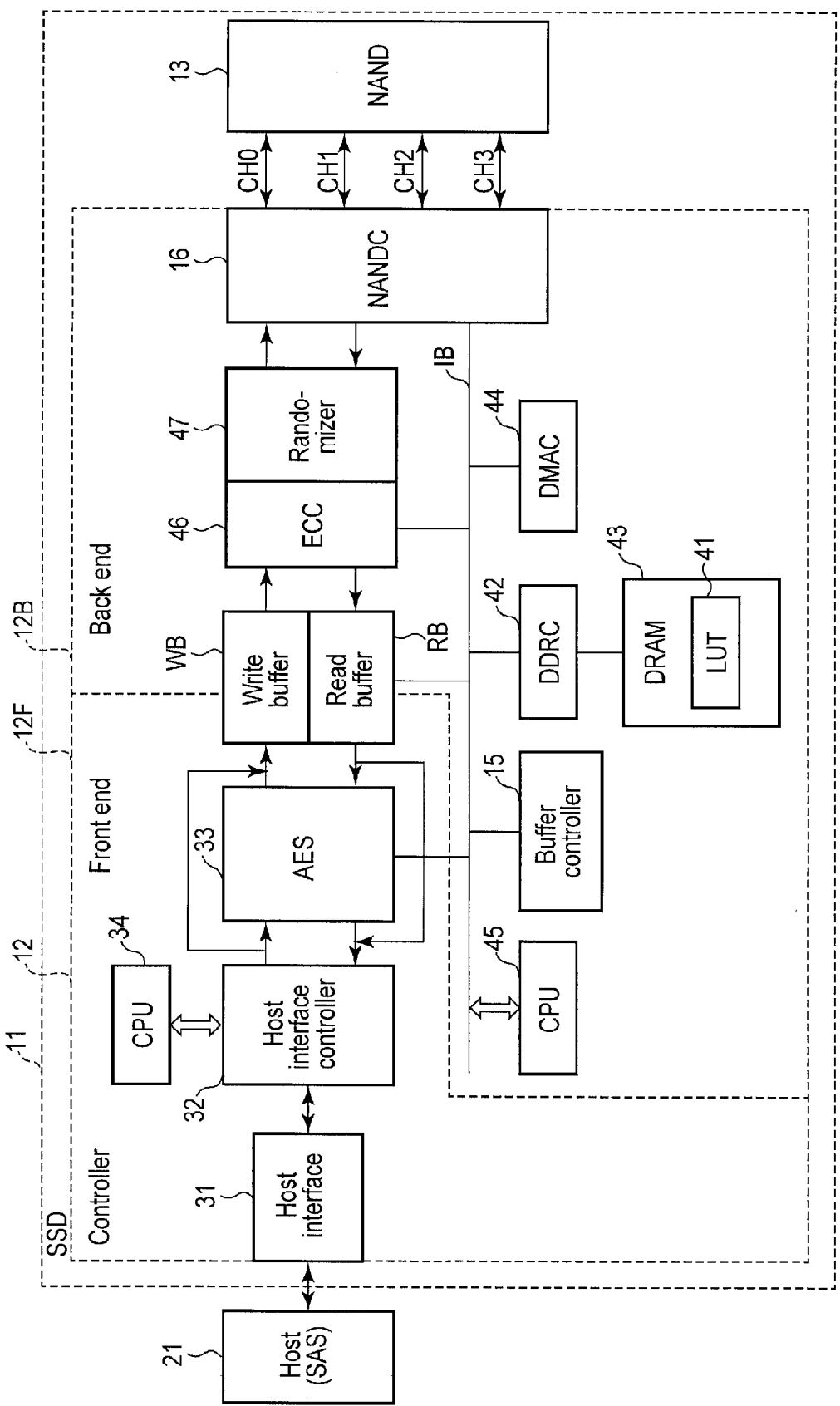
FIG. 12 is a block diagram a memory system according to a second embodiment.

FIG. 12 shows an example of the SSD serving as a memory system according to a second embodiment.

In the SSD 11, the controller 12 includes a front end 12F and a back end 12B.

The front end (host communication module) 12F includes a host interface 31, a host interface controller 32, an encryption/decryption module (Advanced Encryption Standard [AES]) 33, and a CPU 34.

The host interface 31 communicates various types of requests, logical block address (LBA), data, etc., with the host 21. The requests include, for example, a write command, a read command, an erase command, etc.

The host interface controller 32 controls the communication of the host interface 31, under control of the CPU 34.

In the data write operation, the AES 33 encrypts the write data supplied from the host interface controller 32 and supplies the write data to the write buffer WB of the back end 12B. In the data read operation, the AES 33 decrypts the encrypted read data transmitted from the read buffer RB of the back end 12B. The write data and the read data can be transmitted without intervention of the AES 33 as needed.

The host IF 14 shown in FIG. 1 includes, for example, the host interface 31 and the host interface controller 32. However, the host IF is not limited to this configuration.

The CPU 34 controls the host interface 31, the host interface controller 32, and the AES 33 of the front end 12F and also controls overall operations of the front end 12F.

The back end 12B includes a write buffer WB, a read buffer RB, a buffer controller 15, a lookup table (LUT) 41, a double data rate controller (DDRC) 42, a dynamic random access memory (DRAM) 43, a direct memory access controller (DMAC) 44, a CPU 45, an error checking and correction (ECC) 46, a randomizer 47, and a NAND controller (NANDC) 16.

The write buffer WB temporarily stores the write data transmitted from an information processing device 2. More specifically, the write buffer WB temporarily stores the write data until the write data is processed into a predetermined data size suitable for the NAND 13.

The read buffer RB includes SRAM0 to SRAMn and temporarily stores the read data which is read from the NAND 13 as described above.

The LUT 41 is the data for translating a logical block address (LBA) into a physical block address (PBA).

The DDRC 42 controls a double data rate (DDR) in the DRAM 43.

The DRAM 43 is, for example, a nonvolatile memory which stores the LUT 41.

The DMAC 44 transfers the write data, the read data, etc., via an internal bus IB.

The CPU 45 controls each of the components (41 to 44) in the back end 12B, and also controls overall operations of the back end 12B.

The buffer controller 15 is configured as shown in FIG. 2, and selectively controls one of SRAM0 to SRAMn constituting the read buffer RB to be in the power-on state, writes the data to the SRAM in the power-on state and reads the data from the SRAM in the power-on state, as described above.

In FIG. 12, the buffer controller 15 is shown as an independent component including the elements shown in FIG. 2. However, the buffer controller 15 is not limited to this. For example, the buffer controller 15 may also be configured by, for example, firmware including the DDRC 42, the DRAM 43, the DMAC 44, the CPU 45, etc., of the back end 12B. In this case, the descriptor table DT may be stored in, for example, the DRAM 43, and the DMAC 44 may transfer the data by referring to the descriptor table DT in the DRAM 43.

The ECC 46 adds an error-correcting code to the write data supplied from the write buffer WB. When the ECC 46 supplies the data read from the NAND 13 to the read buffer RB, the ECC 46 corrects the data as needed, with the error-correcting code added to the data.

The randomizer 47 disperses the write data to prevent the write data from being concentrated on a specific page or a word line direction of the NAND 13 in the data write operation. In addition, the data read from the NAND 15 passes through the randomizer 47 in the data read operation.

The NANDC 16 accesses the NAND 13 in parallel through a plurality of channels (for example, four channels CH0 to CH3) to meet a request for a predetermined speed.

In addition, NANDs different in design rules or NANDs of different types such as a plane NAND and a stereoscopic NAND are applicable as the SSD 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions.

What is claimed is:

1. A memory device, comprising:
   a nonvolatile memory unit;
   a volatile memory unit including first and second memory modules; and
   a controller configured to store data from the nonvolatile memory unit in the volatile memory unit before the data are transferred to a host, wherein
   while the controller stores the data in the first memory module, the first memory module is in a first power state and the second memory module is in a second power state, the first power state corresponding to a high power consumption state and the second power state corresponding to a low power consumption state.

2. The memory device according to claim 1, wherein the first memory module is moved to the second power state upon completion of the storing of the data in the first memory module.

3. The memory device according to claim 1, wherein the controller is configured to start a process to store the data in the first memory module a predetermined time after the first memory module is moved to the first power state.

4. The memory device according to claim 1, wherein the controller is configured to store additional data from the nonvolatile memory unit in the first memory module consecutively after and upon completion of the storing of the data in the first memory module, while maintaining the first memory module in the first power state.

5. The memory device according to claim 1, wherein the controller is further configured to move the second memory module into the first power state while the data is being stored in the first memory module, and store additional data from the nonvolatile memory unit in the second memory module upon completion of the storing of the data in the first memory module.

6. The memory device according to claim 1, wherein while the data stored in the first memory module is transferred to the host, the first memory module is in the first power state and the second memory module is in the second power state.

7. The memory device according to claim 6, wherein while the data is being transferred from the first memory module to the host, the second memory module is moved to the first power state, and data stored in the second memory module is transferred to the host upon completion of the transferring of the data from the first memory module to the host.

8. The memory device according to claim 7, wherein the controller stores the data in the second memory module after storing the data in the first memory module.

9. The memory device according to claim 1, wherein each of the first and second memory modules has a capacity that is equal to an integer multiple of a unit size of data processed by the host.

10. The memory device according to claim 1, wherein the first power state is a power-on state, and the second power state is a power-off state.

11. A memory device, comprising:
a nonvolatile memory unit;
a volatile memory unit including first and second memory modules; and
a controller configured to store data from the nonvolatile memory unit in the volatile memory unit before the data are transferred to a host, wherein
while the controller transfers data in the first memory module to the host, the first memory module is in a first power state and the second memory module in a second power state, the first power state corresponding to a high power consumption state and the second power state corresponding to a low power consumption state.

12. The memory device according to claim 11, wherein the first memory module is moved to the second power state upon completion of the transferring of the data from the first memory module to the host.

13. The memory device according to claim 11, wherein the controller is configured to start a process to transfer the data in the first memory module to the host a predetermined time after the first memory module is moved to the first power state.

14. The memory device according to claim 11, wherein the controller is configured to move the second memory module into the first power state while the data is being transferred from the first memory module to the host, and transfer data stored in the second memory module to the host upon completion of the transferring of the data stored in the first memory module to the host.

15. The memory device according to claim 14, wherein the controller stores the data in the second memory module after storing the data in the first memory module.

16. The memory device according to claim 11, wherein the first power state is a power-on state, and the second power state is a power-off state.

* * * * *